United States Patent [19]
Gosain et al.

[11] Patent Number: 5,637,180
[45] Date of Patent: Jun. 10, 1997

[54] PLASMA PROCESSING METHOD AND PLASMA GENERATOR

[75] Inventors: Dharam P. Gosain; Jonathan Westwater; Setsuo Usui, all of Kanagawa, Japan

[73] Assignee: Sony Corporation, Tokyo, Japan

[21] Appl. No.: 533,095

[22] Filed: Sep. 25, 1995

[30] Foreign Application Priority Data

Sep. 28, 1994 [JP] Japan ..................... 6-232606

[51] Int. Cl.$^6$ .................. H01L 21/3065; C03C 25/06
[52] U.S. Cl. .................. 156/345; 216/66; 216/67; 118/50.1; 118/719; 438/680; 438/726; 438/798
[58] Field of Search .................. 156/643.1, 345; 204/192.32, 192.35, 298.11, 298.02, 298.34; 118/723 R, 723 E; 427/570, 572; 216/66, 67, 71

[56] References Cited

U.S. PATENT DOCUMENTS

| | | | |
|---|---|---|---|
| 3,297,465 | 1/1967 | Connell et al. | 117/38 |
| 4,526,805 | 7/1985 | Yoshizawa | 427/38 |
| 4,776,923 | 10/1988 | Spencer et al. | 156/643 |
| 4,836,902 | 6/1989 | Kalnitsky et al. | 204/192.32 |

FOREIGN PATENT DOCUMENTS 0 704 552 A1  4/1996  European Pat. Off. .
06-244159  9/1994  Japan .

OTHER PUBLICATIONS

Patent Abstracts of Japan, vol. 018, No. 626 (E-1636), Nov. 29, 1994 & JP-A-06 244159 (Hitachi Ltd), Sep. 2, 1994.

Patent Abstracts of Japan, E Field, vol. 8, No. 626, Nov. 29, 1994 (Nov. 29, 1994, p. 110 E, JP 6-244 159 A (Hitachi Ltd).

*Primary Examiner*—R. Bruce Breneman
*Assistant Examiner*—Michael E. Adjodha
*Attorney, Agent, or Firm*—Hill, Steadman & Simpson

[57] ABSTRACT

A plasma-processing method used in processes for manufacturing semiconductor devices. During plasma processing, ultraviolet radiation is emitted from a region where a plasma is created. An ultraviolet radiation-blocking means blocks the ultraviolet radiation from impinging on the sample surface to protect it. The blocking means passes particles forming a plasma onto the sample surface. The particles passed through the ultraviolet radiation-blocking plates are implanted into the sample. Alternatively, the processed surface of the sample is etched, or a film is deposited on the processed surface of the sample.

2 Claims, 7 Drawing Sheets

SCHEMATIC CROSS SECTION OF SECOND EXAMPLE OF PLASMA GENERATOR

SCHEMATIC CROSS SECTION OF FIRST EXAMPLE OF PLASMA GENERATOR

FIG. 3
POSITIONS AT WHICH UV RAY-BLOCKING MEANS ARE MOUNTED
(1)
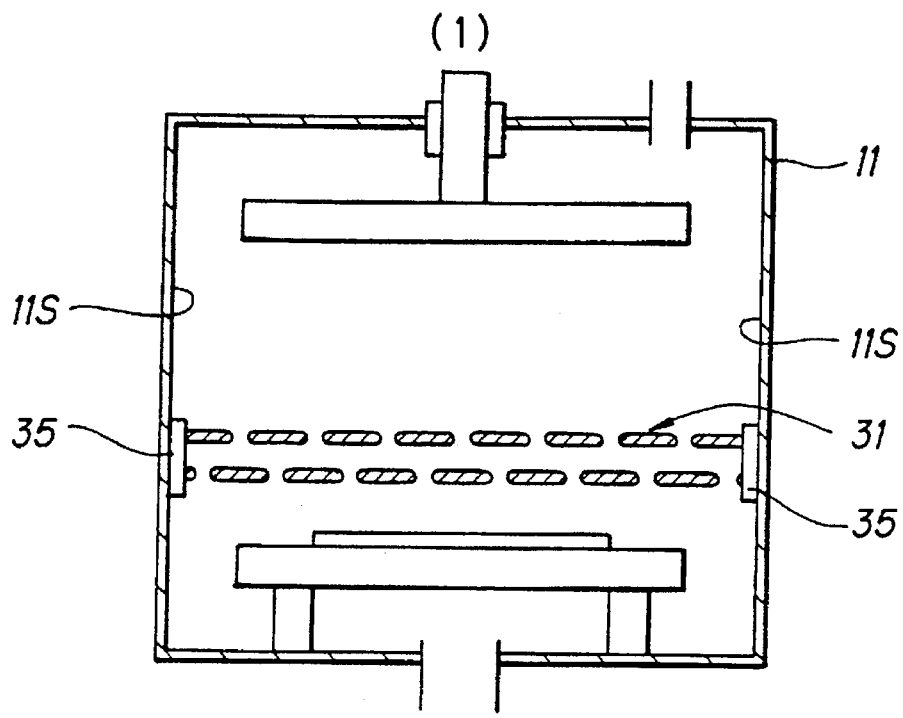
(2)
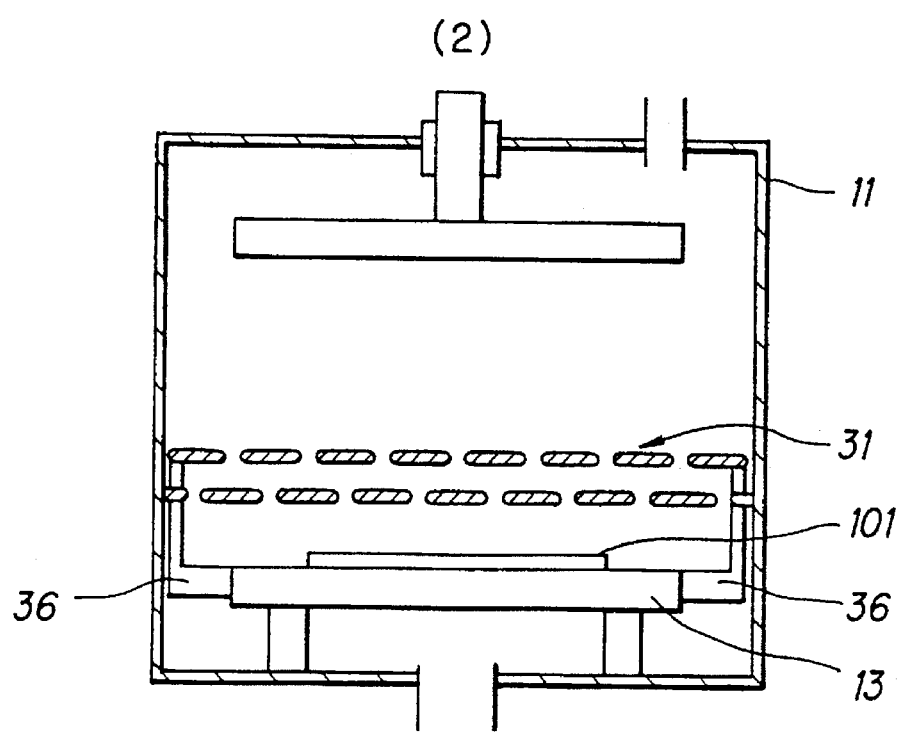

SCHEMATIC CROSS SECTION OF UV RAY-BLOCKING MEANS OF ANOTHER STRUCTURE

SCHEMATIC CROSS SECTION OF UV RAY-BLOCKING MEANS OF FURTHER STRUCTURE

Id-Vg CHARACTERISTIC DIAGRAM ILLUSTRATING PROBLEMS

PLASMA PROCESSING METHOD AND PLASMA GENERATOR

BACKGROUND OF THE INVENTION

1. Field of the Invention

The present invention relates to a plasma processing method and plasma generator for processing semiconductor devices with a plasma during processes for fabricating the devices.

2. Description of the Related Art

In processes for fabricating semiconductor devices, various kinds of processes are performed, using a plasma generator such as a plasma doping system, a plasma-enhanced CVD system, a plasma etching system, and a plasma ashing system. In any of these kinds of processes, a plasma is generated, and processing is performed, using the generated plasma.

In a plasma doping system, a glow discharge plasma is generated, for example, inside a gaseous ambient containing impurity atoms to be doped, to implant the impurity atoms into a sample.

In a plasma-enhanced CVD system, an r.f. glow discharge plasma is generated, for example, in a reactive gas ambient. The reactive gas species is decomposed, thus obtaining atoms. These atoms are deposited as a thin film.

In a plasma etching system, a plasma is generated, for example, in a reactive gas ambient. The etching process is made to proceed by the action of neutral active species. This system includes a plasma ashing system. Alternatively, the etching process is made to proceed by the combined effect of the neutral active species and reactive gas ions. Or, a diverging magnetic field is formed by a magnetic field, and a plasma is radiated from an ion source along the diverging field. As a result, a sample placed in the plasma flow is etched.

In the above-described plasma generator, when a plasma is generated, ultraviolet radiation is emitted from the region where the plasma is created. Therefore, the ultraviolet radiation impinges on the sample under plasma processing. Consequently, the sample is damaged.

One example of this is described by taking hydrogenation using plasma doping as an example. Plasma hydrogenation is a technique consisting of implanting hydrogen into a poly-crystalline silicon film to remove crystal grain boundaries from the silicon film. In this processing, energetic ultraviolet radiation having wavelengths ranging from 110 nm to 180 nm is emitted from the plasma generation region. When a poly-crystalline silicon device is exposed to such UV radiation, the device is readily damaged.

As an example of characteristic of plasma hydrogenated TFT (thin-film transistor), drain current-gate voltage curve (Id-Vg curve) is shown in FIG. 7. In this graph, the drain current is plotted on the vertical axis, whereas the drain voltage is on the horizontal axis.

The device whose characteristic is indicated by the solid-line curve (a) of FIG. 7 was obtained by hydrogenation. This characteristic is considerably better than the characteristic of a device undergone no hydrogenation. However, the characteristic is not very excellent because of damage caused by ultraviolet radiation produced by a glow discharge and because of damage sustained by energetic particles.

Then, the surface of the device to be processed was covered with quartz glass obstructing hydrogen flux. Thereafter, the surface was exposed to ultraviolet radiation emitted from the plasma generation region at 285° C. As a result, a characteristic curve indicated by the broken line of (b) in FIG. 7 was derived. As can be seen from this characteristic curve, the device characteristic was greatly deteriorated by the exposure to the ultraviolet radiation.

The device was then annealed at 285° C. for 1 hour. We checked if this annealing could repair the damage caused by the UV irradiation. As indicated by the characteristic curve (c) indicated by the dot-and-dash line, the device characteristic was healed to some extent, not completely. Accordingly, when the device was exposed to UV radiation, it was damaged, so that the characteristics were deteriorated.

SUMMARY OF THE INVENTION

It is an object of the present invention to provide a plasma processing method and plasma; generator capable of excellently eliminating the effects of UV radiation emitted by the plasma generator.

A plasma processing method for achieving the above-described object uses a plasma region produced inside a chamber. UV radiation emitted from this plasma region is blocked. Particles inside the plasma region are guided to a sample surface so that the particles are implanted into the surface. Alternatively, the sample surface is etched by the particles, or the particles are deposited as a thin film on the sample surface.

A plasma generator for achieving the above-described object produces a plasma inside a chamber. A sample positioned inside the chamber is to be processed. A UV radiation-blocking means which passes particles forming a plasma and blocks UV radiation is mounted between a plasma region and the sample.

In one embodiment of the plasma generator, the plasma region is formed at a position substantially opposite to the processed surface of the sample. The UV radiation-blocking means comprises a plurality of UV radiation-blocking plates each provided with plural holes. These blocking plates are spaced from each other by a given spacing. The blocking plates are so disposed that the holes in the plates are located in a staggered relation to each other. Alternatively, the UV radiation-blocking plates of the UV radiation-blocking means are inclined from the processed surface of the sample and laid to overlap each other with a given spacing therebetween.

In another embodiment of the plasma generator, the plasma region is created along the side wall of a chamber. The UV radiation-blocking means is mounted along the side wall of the chamber via the plasma region. The UV radiation-blocking means is composed of a plurality of UV radiation-blocking plates each provided with a plurality of holes. The UV radiation-blocking plates are spaced from each other with a given spacing therebetween. The holes in these UV radiation-blocking plates are located in a staggered relation to each other. Alternatively, the UV radiation-blocking means comprises a plurality of UV radiation-blocking plates inclined toward the side wall of the chamber. The UV radiation-blocking plates are spaced a given spacing from each other along the side wall of the chamber.

In the aforementioned plasma processing method, the ultraviolet radiation released from the plasma region produced in the chamber is blocked and so the sample surface is shielded from the ultraviolet radiation. Consequently, the sample is not damaged by the ultraviolet radiation. Particles forming a plasma inside the plasma region are guided to the sample surface. In this way, the sample is doped with the particles, the sample surface is etched by the particles, or the particles are deposited as a film on the sample surface. As a result, the sample is processed in a desired manner without being damaged by the UV radiation.

The above-described plasma generator is equipped with the UV radiation-blocking means mounted between the sample and the plasma region created inside the chamber. The UV radiation-blocking means passes particles forming a plasma but blocks the UV radiation. In consequence, the plasma formed by the particles is guided to the sample surface but the UV radiation does not impinge on the surface. Consequently, during plasma processing, the sample is not damaged by the UV radiation.

For example, in the case of a plasma generator where the plasma region is created in a position substantially opposite to the processed surface of the sample, the UV radiation-blocking means is composed of a plurality of UV radiation-blocking plates each provided with a plurality of holes. The UV radiation-blocking plates are spaced from each other by a given spacing such that their respective holes are located in a staggered relation to each other. Therefore, since the UV radiation emitted in the plasma region travels straight, the radiation is blocked by the plural UV radiation-blocking plates. Even if the radiation passes through the holes in the first blocking plate, the radiation is blocked by the second blocking plate. On the other hand, the particles forming a plasma pass through the holes and pass between the blocking plates.

Since the UV radiation-blocking means is inclined to the processed surface of the sample and laid to overlap each other with a given spacing between them, the UV rays traveling straight are blocked by the UV radiation-blocking plates which are mounted obliquely and laid to overlap each other. On the other hand, the particles forming a plasma pass between the blocking plates and reach the sample surface.

Where the plasma generator produces the plasma region along the side wall of the chamber, the UV radiation-blocking means is composed of a plurality of UV radiation-blocking plates each provided with a plurality of holes. The UV radiation-blocking plates are spaced from each other by a given spacing such that the holes in these plates are located in a staggered relation to each other. Therefore, the UV radiation traveling straight is blocked by the UV radiation-blocking plates. Even if the radiation passes through the holes in the first blocking plate, the radiation is blocked by the second blocking plate. On the other hand, the particles forming a plasma pass through the holes and pass between the blocking plates and reach the sample surface.

Where the UV radiation-blocking means is composed of a plurality of UV radiation-blocking plates which are inclined toward the side wall of the chamber and arranged along the side wall of the chamber via a given space, the UV radiation is blocked by the UV radiation-blocking plates. On the other hand, the particles forming a plasma pass between the blocking plates and reach the sample surface.

Other objects and features of the invention will appear in the course of the description thereof, which follows.

BRIEF DESCRIPTION OF THE DRAWINGS

FIGS. 3(1) and 3(2) are views illustrating the positions at which UV radiation-blocking means according to the invention are mounted;

DESCRIPTION OF THE PREFERRED EMBODIMENTS

A plasma processing method according to the present invention is described below. As one example of the plasma processing method, a hydrogen doping method is now described by referring to FIG. 1.

Figure 1:
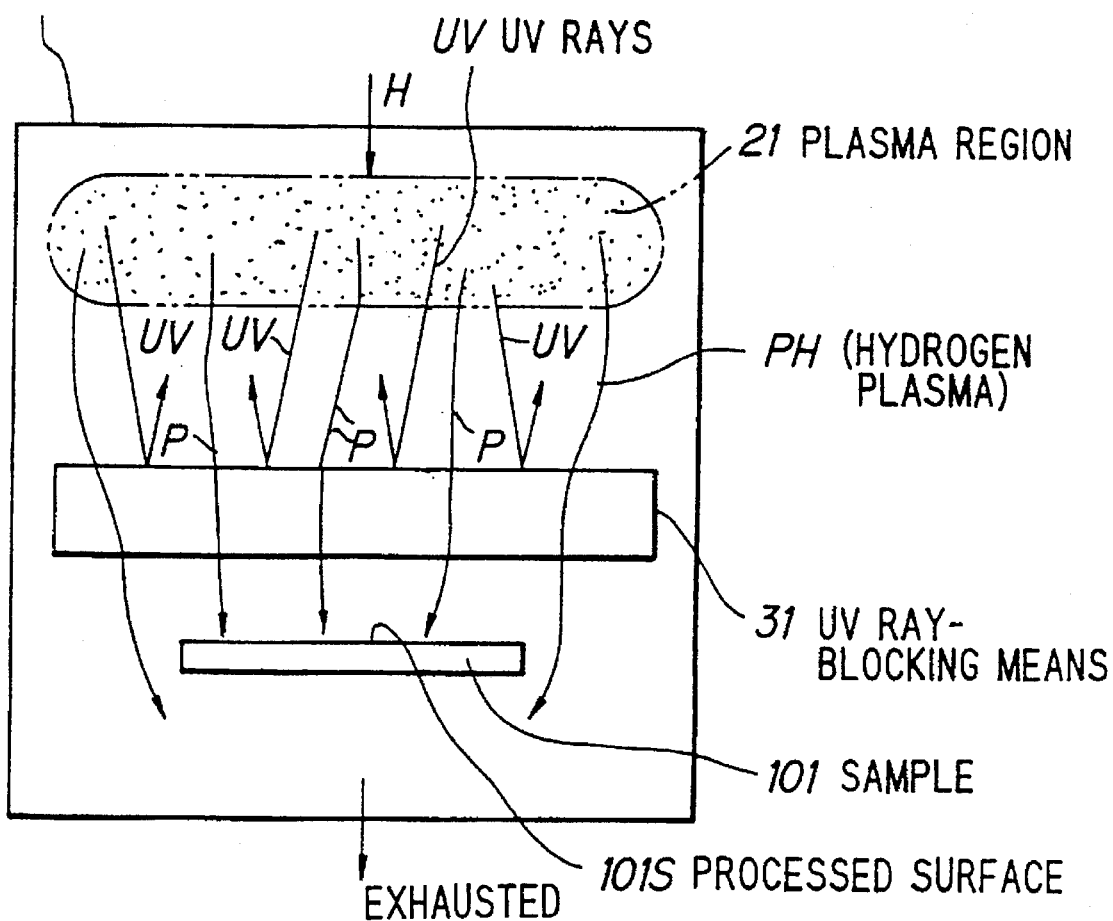
FIG. 1 is a schematic view illustrating one example of plasma processing method according to the present invention.

In FIG. 1, a sample 101 is first placed in position within a chamber 11 in order to effect a hydrogen doping process. The inside of the chamber 11 is pumped down to a high vacuum by an evacuating means (not shown). Then, hydrogen gas H is admitted into the chamber up to a given pressure. During the introduction of the hydrogen gas H, the inside of the chamber 11 is being evacuated by the evacuating means and kept at a given pressure. The hydrogen gas is changed into a plasma PH (hereinafter referred to as the hydrogen plasma), for example, by a glow discharge inside the chamber 11.

The generated hydrogen plasma PH is introduced into the sample 101, thus carrying out the hydrogen doping process. At this time, ultraviolet radiation UV traveling straight is emitted from a plasma region 21 where the hydrogen plasma PH is generated. The straightness is indicated by the arrows attached to the straight lines stemming from the plasma region 21. On the other hand, the hydrogen plasma PH is in a gaseous state. Utilizing these properties, a UV radiation-blocking means 31 permits only the hydrogen plasma PH to reach the processed surface 101S of the sample 101. In particular, the blocking means 31 acts like a filter which blocks the UV radiation traveling straight but passes the hydrogen plasma PH capable of following even a serpentine path.

In the above-described plasma processing method, the ultraviolet radiation UV emitted from the plasma region 21 inside the chamber 11 is blocked and so the ultraviolet radiation UV does not impinge on the processed surface 101S of the sample 101. Therefore, the sample 101 is not damaged by the effect of the ultraviolet radiation UV. The hydrogen plasma PH in the plasma region 21 is introduced into the processed surface 101S of the sample 101. In this way, the sample 101 is doped with the hydrogen plasma PH.

The above-described plasma processing method utilizes plasma doping. Instead, plasma etching, plasma ashing, plasma-enhanced CVD, or plasma anodization may also be carried out. In this case, the ultraviolet radiation emitted from the plasma region is blocked and only a plasma consisting of particles of hydrogen is caused to reach the sample surface, in the same way as the foregoing. In consequence, processing can be performed without being affected by the ultraviolet radiation. In particular, dangling bonds which would have been heretofore generated in the sample by ultraviolet irradiation, are not produced.

Figure 2:
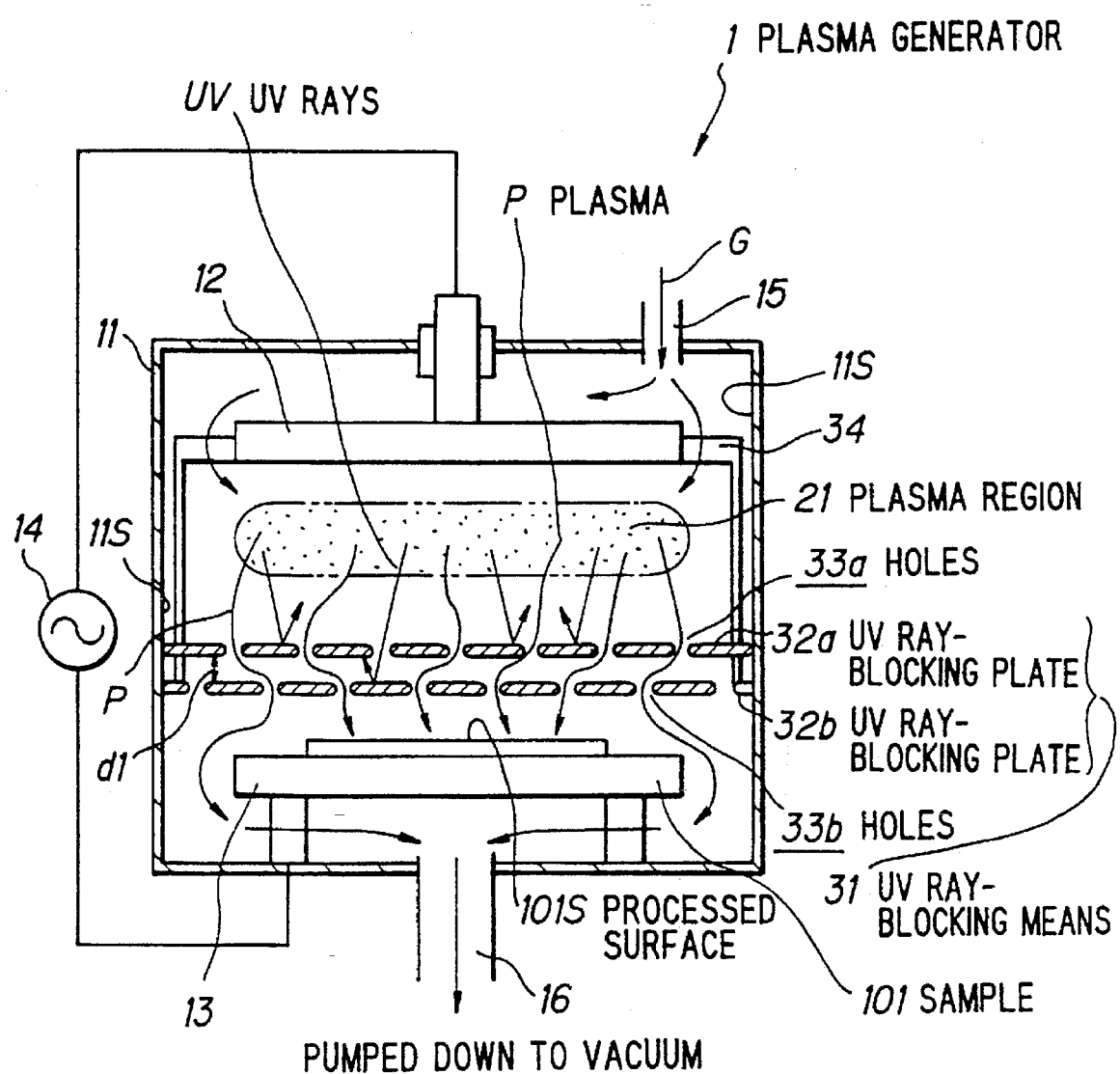
FIG. 2 is a schematic cross section of a plasma generator according to the invention.

A first example of the novel plasma generator is described by referring to the schematic cross section of FIG. 2. It is to be noted that like components are indicated by like reference numerals in various figures.

This plasma generator is intended to carry out the aforementioned plasma processing method. As shown in FIG. 2, the plasma generator, generally indicated by reference numeral 1, has a chamber 11. A sample 101 having a surface 101S to be processed is disposed inside the chamber 11. Particles forming a plasma P are generated in a position substantially opposite to the processed surface 101S to plasma-etch the processed surface 101S. As an example, the chamber 11 has ordinary parallel-plate electrodes 12 and 13. Therefore, the plasma P is generated between the first electrode 12 and the second electrode 13. The sample 101 is placed on the second electrode 13. A power supply 14 is connected with the two electrodes 12 and 13.

The top wall of the chamber 11 is provided with a gas inlet portion 15 for introducing a process gas G. The bottom wall of the chamber 11 is provided with an exhaust portion 16 for evacuating the inside of the chamber.

The plasma generator 1 is further equipped with an ultraviolet radiation-blocking means 31 mounted between the plasma region 21 in which the plasma P is generated and the sample 101 on the second electrode 13. The blocking means 31 passes the plasma P but blocks the ultraviolet radiation UV released from the plasma region 21, the radiation UV being indicated by the arrows of straight lines issuing from the plasma region 21. The path of the plasma P is indicated by the arrows of the curved lines issuing from the plasma region 21.

The ultraviolet radiation-blocking means 31 consists of two blocking plates 32a and 32b which are located substantially parallel to each other and spaced, for example a given distance d1, from each other. The blocking plates 32a and 32b are provided with plural holes 33a and 33b, respectively, which are located in a staggered relation to each other. That is, when viewed from the plasma region 21, it is impossible to see the sample 101 through the holes 33a and 33b.

For example, the ultraviolet radiation-blocking means 31 is mounted to the first electrode 12, for example via an insulator 34. The side surface of the ultraviolet radiation-blocking means 31 is connected to the side wall 11S of the chamber 11 to prevent the plasma P from being pumped from the side of the ultraviolet radiation-blocking means 31.

In the plasma generator 1 described above, the ultraviolet radiation-blocking means 31 for passing the plasma P and blocking the ultraviolet radiation UV is mounted between the plasma region 21 and the sample 101, the plasma region 21 being created inside the chamber 11. Therefore, the plasma P is forced onto the processed surface 101S of the sample 101 but the ultraviolet radiation UV does not hit the processed surface because the radiation is blocked by the ultraviolet radiation-blocking means 31.

More specifically, the ultraviolet radiation UV generated in the plasma region 21 travels straight and so the ultraviolet radiation UV is blocked by the plural ultraviolet radiation-blocking plates 32a and 32b of the ultraviolet radiation-blocking means 31. Even if the ultraviolet radiation UV passes through the holes 33a formed in the first ultraviolet radiation-blocking plate 32a, the radiation UV passed through the first plate 32a is almost totally blocked by the second ultraviolet radiation-blocking plate 32b, because the holes 33a and 33b are located in a staggered relationship to each other. On the other hand, the plasma P passes through the holes 33a and 33b and between the ultraviolet radiation-blocking plates 32a and 32b and reaches the processed surface 101S of the sample 101. Consequently, the sample 101 is not damaged by the ultraviolet radiation UV during the plasma processing.

The positions at which the ultraviolet radiation-blocking means 31 is mounted is not limited to the surface of the electrode 12. For example, as shown in FIG. 3(1), the ultraviolet radiation-blocking means 31 may be mounted to the side wall 11S of the chamber 11 either via an insulator 35 or directly. Furthermore, as shown in FIG. 3(2), the ultraviolet radiation-blocking means 31 may be mounted via an insulator 36 to the second electrode 13 consisting, for example, of a stage on which the sample 101 is placed.

Figure 4:
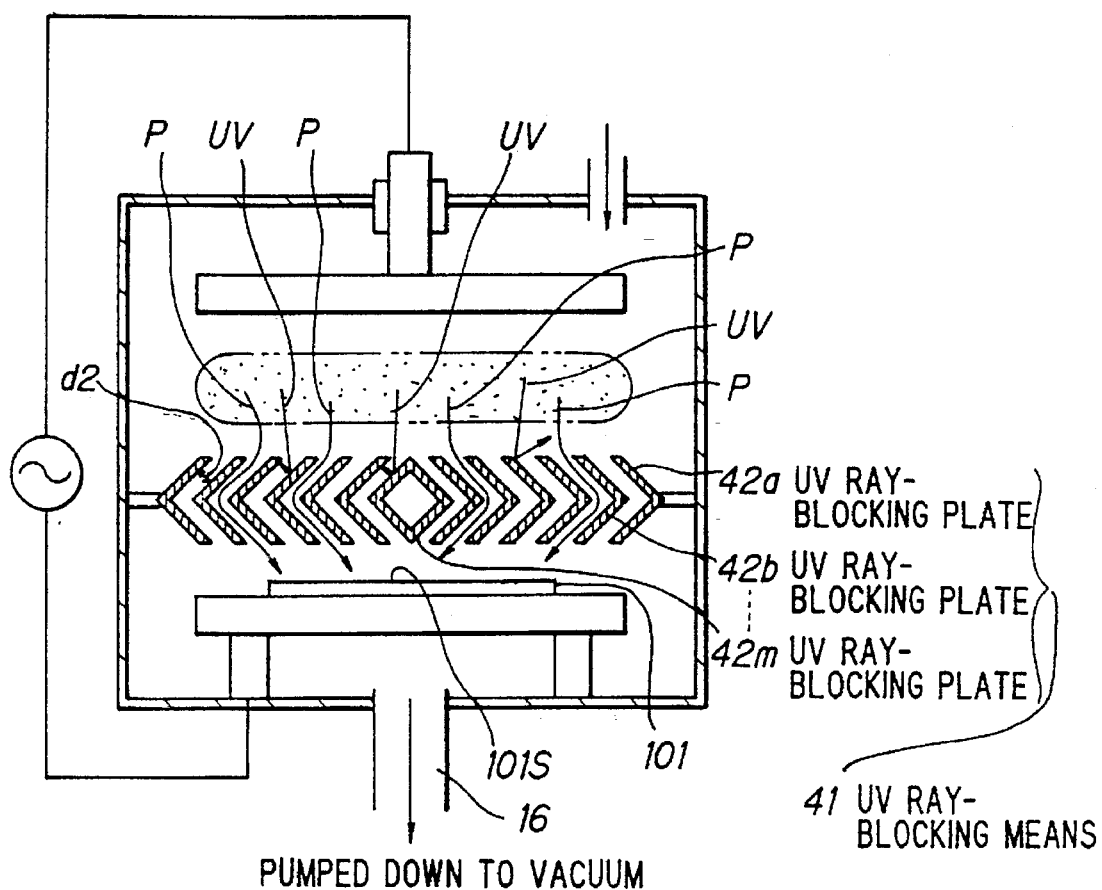
FIG. 4 is a schematic cross section of other UV radiation-blocking means according to the invention.

An ultraviolet radiation-blocking means 41 of another configuration is next described by referring to the schematic cross section of FIG. 4. This ultraviolet radiation-blocking means 41 comprises a plurality of (e.g., m) annular ultraviolet radiation-blocking plates 42a, 42b, . . . , 42m of substantially U-shaped cross section. These ultraviolet radiation-blocking plates 42a–42m are inclined to the processed surface 101S of a sample 101. The ultraviolet radiation-blocking plates 42a–42m are laid to overlap each other with a given spacing d2 between them. That is, where viewed from the above, the sample cannot be seen through the spaces between the successive ultraviolet radiation-blocking plates 42a–42m.

In the ultraviolet radiation-blocking means 41 of the above-described structure, the ultraviolet radiation-blocking plates 42a–42m are inclined to the processed surface 101S of the sample 101 and spaced the given spacing d2 from each other. Under this condition, the blocking plates are laid to overlap each other. The ultraviolet radiation UV emitted from the plasma region 21 is blocked by the ultraviolet radiation-blocking plates 42a–42m because of the straightness of the propagation of the ultraviolet radiation UV. On the other hand, the plasma P in the plasma region 21 is allowed to pass between the successive ultraviolet radiation-blocking plates 42a–42m because the inside of the chamber is being evacuated by the exhaust portion 16. Then, the plasma reaches the processed surface 101S of the sample 101.

Besides the parallel-plate electrode plasma generator 1 described above, either the ultraviolet radiation-blocking means 31 or the ultraviolet radiation-blocking means 41 can be mounted. That is, if the system produces a plasma inside a chamber and performs plasma processing, the system can be equipped with either the ultraviolet radiation-blocking means 31 or the ultraviolet radiation-blocking means 41. The plasma processing includes doping (that is a process involving a change in property), oxidation, etching (that is a removing process), ashing, and CVD methods (which are processes for forming films). Examples of the system include ECR plasma generators and microwave plasma generators, as well as parallel-plate plasma generators. The plasma generator can take the form of doping system, etching system, CVD system, or ashing system.

Figure 5:
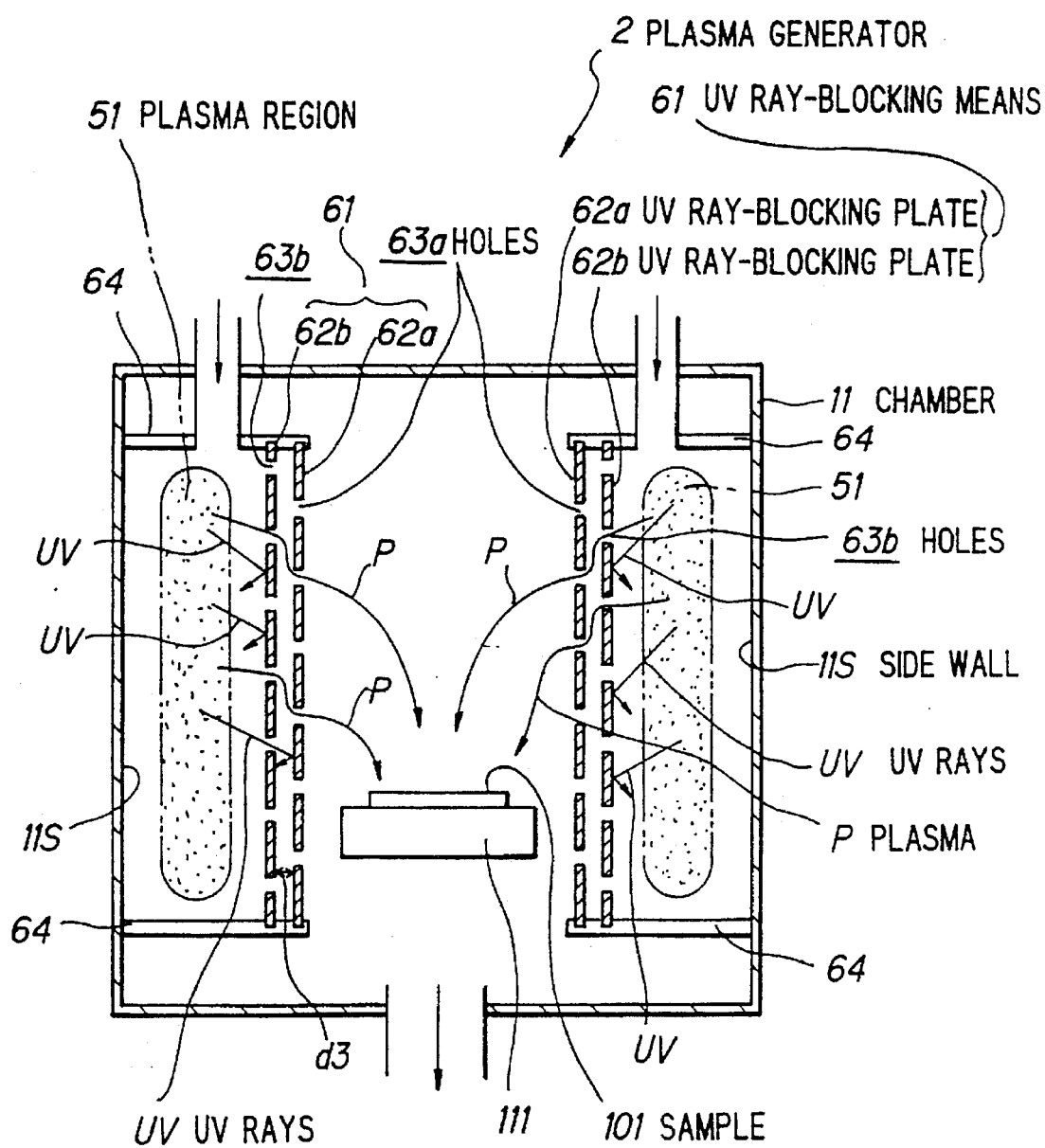
FIG. 5 is a schematic cross section of another plasma generator according to the invention.

A second example is described by referring to the schematic cross section of FIG. 5. It is to be noted that like components are indicated by like reference numerals in various figures. In FIG. 5, a plasma generator, generally indicated by reference numeral 2, produces a plasma P along the side wall 11S of a chamber 11. A sample 101 positioned inside the chamber 11 has a surface 101S to be processed. The plasma P is generated from the side of the processed surface 101S to the top to plasma-etch the processed surface 101S.

The positional relation among a plasma region 51 where the plasma P is generated, the sample 101, and an ultraviolet radiation-blocking means 61 is shown. Means for generating the plasma is not shown.

Specifically, the plasma region 51 is produced along the side wall 11S of the chamber 11. A sample 101 is placed on a stage 111 on the side of the bottom of the chamber 11. The ultraviolet radiation-blocking means 61 is mounted between the plasma region 51 and the sample 101 to pass the plasma P and to block the ultraviolet radiation UV released from the plasma region 51.

The ultraviolet radiation-blocking means 61 consists of two cylindrical blocking plates 62a and 62b which are located substantially coaxially about the sample 101. The cylindrical blocking plates 62a and 62b are spaced from each other by a given spacing d3, for example. The blocking plates 62a and 62b are provided with plural holes 63a and 63b, respectively, which are located in a staggered relation to each other. That is, where the side wall of the chamber 11 is viewed from above the sample 101, the holes 63b do not register with the holes 63a.

The ultraviolet radiation-blocking means 61 is mounted to the side wall of the chamber 11 via an insulator 64 in such a way that a plasma region 51 is secured between the side wall 11S of the chamber 11 and the ultraviolet radiation-blocking means 61.

In the plasma generator 2 described above, the ultraviolet radiation-blocking means 61 is mounted between the sample 101 and the plasma region 51 created inside the chamber 11 to pass the plasma P and to block the ultraviolet radiation UV. Therefore, the plasma P is guided onto the processed surface 101S of the sample 101 but the ultraviolet radiation UV does not impinge on the processed surface 101S. Hence, the sample 101 is not damaged by the ultraviolet radiation UV during the plasma processing.

In the ultraviolet radiation-blocking means 61 described above, the ultraviolet radiation UV generated in the plasma region 51 travels straight and thus blocked by the plural ultraviolet radiation-blocking plates 62a and 62b. Even if the radiation passes through the holes 63a in the first ultraviolet radiation-blocking plate 62a, the radiation is almost totally blocked by the second ultraviolet radiation-blocking plate 62b, because the two sets of holes 63a and 63b are located in a staggered relation to each other. On the other hand, the plasma P passes through the holes 63a and 63b and reaches the processed surface 101S of the sample 101.

The position at which the ultraviolet radiation-blocking means 61 is mounted is not limited to the side wall of the chamber 11. The ultraviolet radiation-blocking means 61 may be mounted at any arbitrary position as long as the plasma region 51 is secured.

Figure 6:
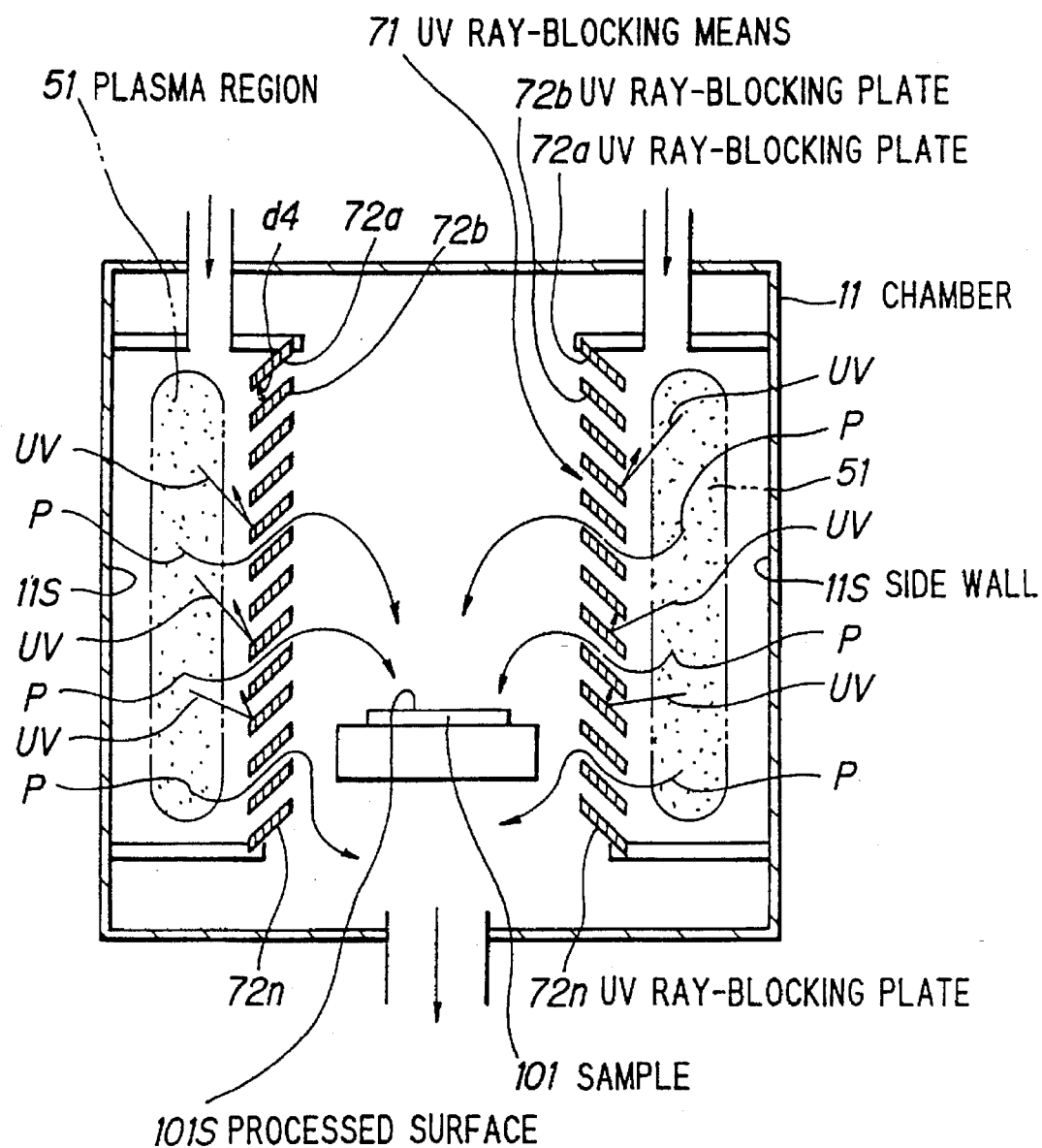
FIG. 6 is a schematic cross section of a further UV radiation-blocking means according to the invention.
Figure 7:
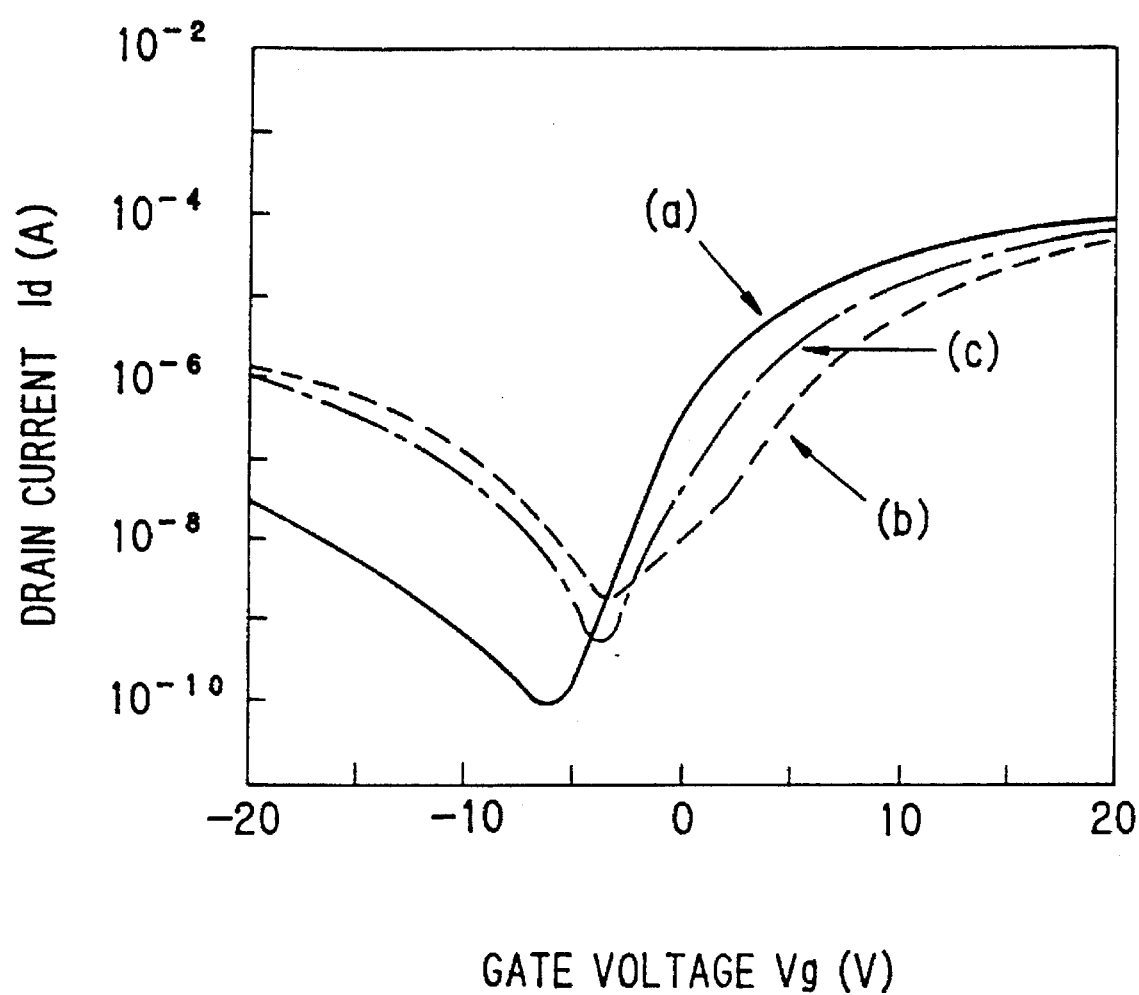
FIG. 7 is a graph showing the Id-Vg characteristics of devices undergone the prior art plasma hydrogenation processing, illustrating the problems with the prior art processes.

An ultraviolet radiation-blocking means 71 of further configuration is described next by referring to the schematic cross section of FIG. 6. The ultraviolet radiation-blocking means 71 comprises a plurality of (e.g., n) substantially annular ultraviolet radiation-blocking plates 72a, 72b, . . . , 72n which are spaced a given spacing of d4 from each other. The blocking plates 72a–72n are inclined to the side wall 11S of a chamber 11. The blocking plates 72a–72n are arranged along the side wall 11S via the plasma region 51. For example, the blocking plates 72a–72n are laid to overlap each other successively, for example, from the side wall 11S of the chamber 11 toward the center.

In the ultraviolet radiation-blocking means 71 of the configuration described above, the ultraviolet radiation-blocking plates 72a–72n are inclined to the processed surface 101S of the sample 101 and spaced the given spacing of d4 from each other. Furthermore, the radiation-blocking plates 72a–72n are laid to overlap each other. Therefore, the ultraviolet radiation UV traveling straight is blocked by the ultraviolet radiation-blocking plates 72a–72n. On the other hand, the plasma P passes between the successive ultraviolet radiation-blocking plates 72a–72n and arrives on the processed surface 101S of the sample 101.

As described thus far, in the novel plasma processing method, ultraviolet radiation emitted from a plasma region created in a chamber is blocked. Therefore, the sample is shielded from the ultraviolet radiation. Consequently, the sample is prevented from being damaged by the ultraviolet radiation. Particles inside the plasma region are guided to the sample surface. As a result, the sample is doped with the particles, the sample surface is plasma-etched, or the particles are deposited as a thin film on the sample surface. As a consequence, the sample can be processed in a desired manner without being damaged. Accordingly, where a semiconductor device is formed on the sample, the electrical characteristics of the semiconductor device can be enhanced.

In the novel plasma generator, there is provided an ultraviolet radiation-blocking means mounted between a plasma region created in a chamber and a sample. The blocking means passes particles forming a plasma but blocks ultraviolet rays. Therefore, the particles forming the plasma are guided onto the sample surface but the sample surface is prevented from being irradiated with the ultraviolet rays. Consequently, during plasma processing, the sample is not damaged by the ultraviolet rays. Hence, a semiconductor device having excellent electrical characteristics can be fabricated.

What is claimed is:

1. A plasma generator comprising:

a processing chamber including a bottom wall and at least one upstanding sidewall;

a substrate holder for mounting a substrate to be processed disposed in a horizontal orientation parallel to and adjacent said bottom wall in a central location in said processing chamber;

means for generating a plasma in at least one plasma region extending parallel to and adjacent said at least one sidewall;

at least one ultraviolet radiation blocking assembly mounted in a vertical orientation in said chamber parallel to and adjacent said at least one sidewall and disposed intermediate a said plasma region and the substrate holder, each said blocking assembly including a plurality of apertured plates disposed in parallel spaced relation so that the apertures of a first plate are staggered with respect to the apertures of an adjacent plate.

2. A plasma generator comprising:

a processing chamber including a bottom wall and at least one upstanding sidewall;

a substrate holder for mounting a substrate to be processed disposed in a horizontal orientation parallel to and adjacent said bottom wall in a central location in said processing chamber;

means for generating a plasma in at least one plasma region extending parallel to and adjacent said at least one sidewall;

at least one ultraviolet radiation blocking assembly mounted in a vertical orientation in said chamber parallel to and adjacent said at least one sidewall and disposed intermediate a said plasma region and the substrate holder, each said blocking assembly including a linear array of parallel spaced apart blocking plates, each blocking plate being disposed at an angled orientation with respect to said sidewall.

* * * * *